United States Patent [19]
Stephan et al.

[11] Patent Number: 5,913,581
[45] Date of Patent: Jun. 22, 1999

[54] INTEGRATED SLIDES FOR HIGH VOLUME PRODUCTION OF ELECTRONIC COMPONENTS

[75] Inventors: Frank Martin Stephan, Galveston; Thurman Russell Reed, Indianapolis, both of Ind.

[73] Assignee: Delco Electroncis Corporation, Kokomo, Ind.

[21] Appl. No.: 08/784,627

[22] Filed: Jan. 21, 1997

[51] Int. Cl.⁶ .................................................... H05K 5/00
[52] U.S. Cl. .............................. 312/223.2; 312/334.27; 312/248; 248/223.41; 361/727
[58] Field of Search ............................ 312/223.2, 223.1, 312/242, 293.1, 293.2, 293.3, 330.1, 334.23, 334.27, 350; 248/223.41; 361/685, 683, 724, 725, 726, 727, 802, 796, 829

[56] References Cited

U.S. PATENT DOCUMENTS

| | | | |
|---|---|---|---|
| 1,545,016 | 7/1925 | Sessions | 312/334.27 X |
| 2,000,463 | 5/1935 | Browne | 312/334.27 X |
| 5,019,948 | 5/1991 | Steketee et al. | 361/727 X |
| 5,164,886 | 11/1992 | Chang | 361/829 X |
| 5,226,625 | 7/1993 | Hanna | 248/222.13 |
| 5,235,493 | 8/1993 | Yu | 312/223.2 X |
| 5,236,259 | 8/1993 | Ryan et al. | 312/223.2 X |
| 5,584,396 | 12/1996 | Schmitt | 361/727 X |

FOREIGN PATENT DOCUMENTS 520916  1/1956  Canada ............................ 312/334.27

*Primary Examiner*—Jose V. Chen
*Assistant Examiner*—Janet M. Wilkens
*Attorney, Agent, or Firm*—Jimmy L. Funke

[57] ABSTRACT

An electrical package, such as a stereo for an automobile comprises a chassis and one or more subassemblies adapted to mate with the chassis. One or more flanges extend from the chassis and each subassembly includes one or more edges each adapted to be securely held in place by one or more of the flanges. Preferably, the flanges and the edges are adapted to mate in sliding engagement with one another. Thus, the electrical package can be assembled without the use of threaded fasteners.

4 Claims, 4 Drawing Sheets

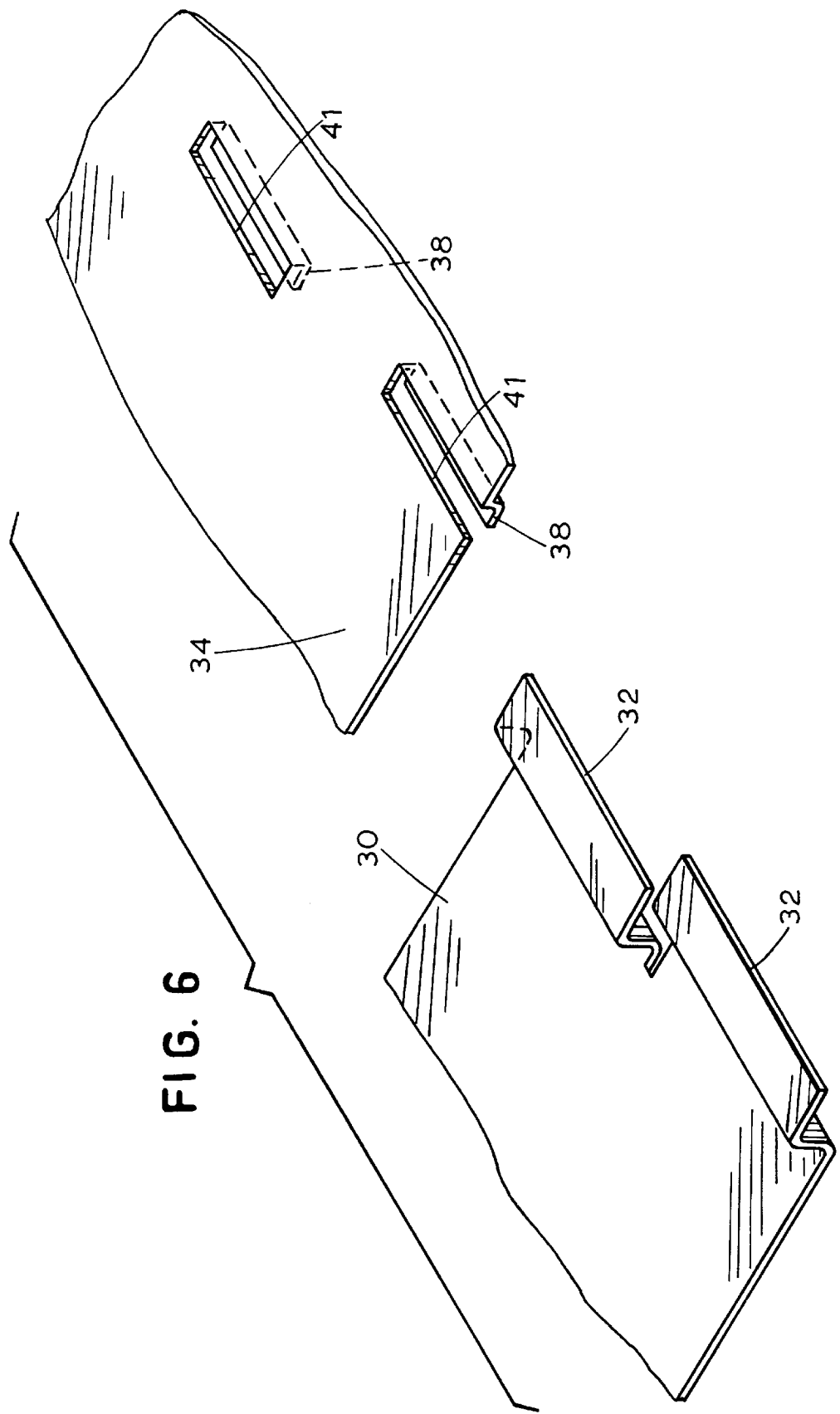

INTEGRATED SLIDES FOR HIGH VOLUME PRODUCTION OF ELECTRONIC COMPONENTS

BACKGROUND OF THE INVENTION

1. Field of the Invention

The present invention relates generally to apparatus for enclosing electrical subassemblies, and more specifically relates to apparatus for releasably securing a subassembly to a chassis of an electrical assembly such as an automobile stereo, compact disc playing mechanism, cassette tape playing mechanism, computer or disk drive mechanism.

2. Description of Related Art

Devices such as automobile stereos or personal computers typically contain subassemblies such as cassette playing mechanisms or disk drives that are attached to a chassis using threaded fasteners. The chassis provides structural support for the subassemblies and also provides electromagnetic shielding to limit electromagnetic interference (EMI) experienced by, and/or created by the device. The fasteners ensure that each subassembly within the chassis is properly located and securely retained within the chassis.

The use of such fasteners can have numerous drawbacks, particularly in a high volume production setting. The fastening process can vary, but there is usually some degree of automation required, ranging from manually loading a screw into a bit on a pneumatic driver to using self-feeding screw machines. Typically, the torque applied by the device used to drive the fasteners must be monitored daily and adjusted in order to assure proper seating of the fasteners. When fasteners are used, sheet metal tolerances have to be maintained at tight levels to allow for the minimization of stress in the assembly when aligning multiple fasteners with corresponding holes in the chassis and the subassembly.

When threaded fasteners are used to assemble an electrical device, the assembly cycle time can be very long especially in high volume production. An operator assembling the device must typically obtain the threaded fastener, bring it in contact with the driver bit, then drive the threaded fastener. Furthermore, using threaded fasteners presents a risk of any one or more of the following upstream failures occurring: stripping of threads; insufficient torque resulting in an unseated fastener; foreign object damage due to fasteners and/or metal shavings dropping into the assembly and/or subassembly; and stripping the head of the threaded fastener. Also, a fastener installation tool such as a driver and bit can slip off the fastener and impact an electrical component resulting in a damaged assembly.

If self-tapping fasteners are used, the process of driving the self-tapping fasteners into sheet metal often causes shavings of sheet metal to disperse into the assembly. Such shavings have been known to cause electrical failures that can permanently damage the product. If self-tapping fasteners are not used, an extra production step is necessary to form threads in the sheet metal of the chassis and/or the subassembly to be installed within the chassis.

Fasteners further require an additional inventory burden on the production line in that the production line must be continuously stocked with part numbers (fasteners) other than the integral components that add value to the assembly. Also, special tools specifically required for assembly using fasteners, such as drivers and bits, must be continuously monitored and maintained for proper performance, wear and torque specifications. Typically, the top and/or bottom surface of the chassis must be secured in place after the subassembly is attached to the chassis.

Special fixtures are often required on the production line to hold a subassembly in the proper location while it is mounted within the chassis with fasteners. Such fixtures can be very complex, and the use of such fixtures usually requires extra handling of both the subassembly and of the resulting assembly thereby adding to the production cycle time and potentially compromising quality of the final product.

Sometimes tabs are cut and bent out of the chassis in order to retain a subassembly. However, when the tabs are small, they are typically too weak to be effective, and when the tabs are large, openings formed when each tab is bent provides a channel for EMI into and out of the chassis.

Accordingly, there is need for electrical assemblies that do not require fasteners, fixtures or tooling for the process of securing subassemblies into a chassis while still providing structural integrity and adequate shielding to minimize EMI. Such assemblies can provide for improved assembly line efficiency and improved product quality.

SUMMARY OF THE INVENTION

An apparatus and method for assembling electrical subassemblies into a chassis is disclosed. The invention is particularly applicable to automobile stereos, compact disk playing mechanisms, cassette tape playing mechanisms, computers and disk drive mechanisms.

In accordance with one aspect of the present invention, a chassis adapted to form part of an assembly is provided. The chassis is adapted to mate with one or more subassemblies, and one or more flanges extend from the chassis. Each flange is adapted to releasably securely retain a corresponding edge of one of the subassemblies. Preferably, the chassis is constructed of sheet metal and each flange is formed during a stamping operation. Openings corresponding to each flange that are formed in the chassis during the stamping operation are adapted to be covered by the corresponding edge when the assembly is assembled.

In accordance with another aspect of the present invention, a subassembly adapted to form part of an assembly, and adapted to mate with a chassis, includes one or more edges extending from the subassembly. Each edge is adapted to be releasably securely retained by a corresponding flange on the chassis.

In accordance with the yet another aspect of the present invention, an electrical package comprises a chassis and a subassembly adapted to mate with the chassis. One or more flanges extend from the chassis and the subassembly includes one or more edges each adapted to be securely held in place by one or more of the flanges. Preferably, the flanges and the edges are adapted to mate in sliding engagement with one another. The invention simplifies the process of assembling the electrical package and the mechanical connection of the subassembly to the chassis can be achieved simultaneously with the electrical connection thereof, for example, by using a direct interconnect with long pins and a connector header, oriented such that the electrical connection is made when the edges of the subassembly are inserted into the corresponding flanges of the chassis.

In a preferred embodiment of the present invention, the flanges and the chassis define a channel-shaped passage for holding one or more of the edges of the subassembly, and each edge includes a retaining feature. The retaining feature helps to retain the subassembly in a proper position within the chassis. This is especially important in automotive applications where it is necessary to prevent rattles caused by loose subassemblies. The retaining feature may either be a planar extension of the edge or a raised portion on the subassembly adjacent to the edge. Alternatively, dimensional tolerancing may be used to provide frictional retaining force.

Typically, the edge of the subassembly is adapted to be securely held in place by one or more of the flanges of the chassis. The edge is located near the periphery of the subassembly and at least one flange is integral with the chassis.

In another aspect of the above-described invention, the electrical package comprises a chassis including a substantially planar surface having a plurality of integral flanges. Each flange has a first portion substantially perpendicular to the planar surface and a second portion substantially parallel to the planar surface. A subassembly adapted to mate with the chassis includes one or more edges to be securely held in place by each flange in a position adjacent to the first portion and between the second portion and the planar surface of the chassis.

In accordance with yet another aspect of the above described invention, a sheet metal chassis, forming part of an assembly, and adapted to mate with one or more subassemblies, comprises one or more flanges extending from the sheet metal chassis. Each flange is adapted to releasably securely retain a corresponding edge of one of the subassemblies. Preferably, each flange is formed during a stamping operation and openings corresponding to each flange are formed in the sheet metal chassis during the stamping operation. Each such opening is adapted to be covered by the corresponding edge of the subassembly when the assembly is assembled.

The flanges on the chassis allow assembly to be performed by simply aligning the edges of the subassembly with the flanges of the chassis and sliding the subassembly into the chassis. The assembly procedure does not require any tools, fixtures or fasteners and thereby reduces the assembly cost and improves product quality by reducing cycle time and eliminating several steps of handling.

The flanges are designed in such a way that the edges of the subassembly cover up any openings in the sheet metal of the chassis resulting from the stamping operation used to form the flanges. Accordingly, covering these openings in the chassis can effectively prevent EMI emissions and/or susceptibility problems. No shavings or foreign particles are created during the process of sliding the subassembly into the chassis, thereby avoiding potential problems such as catastrophic product failures due to electrical shorting.

In accordance with a further aspect of the present invention, a method for assembling an assembly, that includes a chassis adapted to mate with one or more subassemblies, is provided. The method comprises the steps of: providing one or more flanges extending from the chassis; providing a corresponding edge on one of the subassemblies wherein each flange is adapted to releasably securely retain the corresponding edge; and mating the corresponding edge with the flange.

By using the present invention, the chassis can be a five-sided one-piece assembly before other subassemblies are placed inside the chassis. In electrical packages that use threaded fasteners to secure each subassembly to the chassis, two or more sides of a typical five-sided chassis are left off of the chassis during assembly to allow access to the subassembly and fasteners. Thus, in addition to reducing the number of parts required for assembly by eliminating fasteners, the invention allows fewer parts and/or assembly steps to be used for constructing the chassis.

The invention itself, together with further objects and attendant advantages, will best be understood by reference to the following detailed description, taken in conjunction with the accompanying drawings.

BRIEF DESCRIPTION OF THE DRAWINGS

FIG 6. is a fragmentary perspective view of offset chassis flanges and subassembly edges in accordance with the present invention.

DETAILED DESCRIPTION OF THE DRAWINGS

Figure 1:
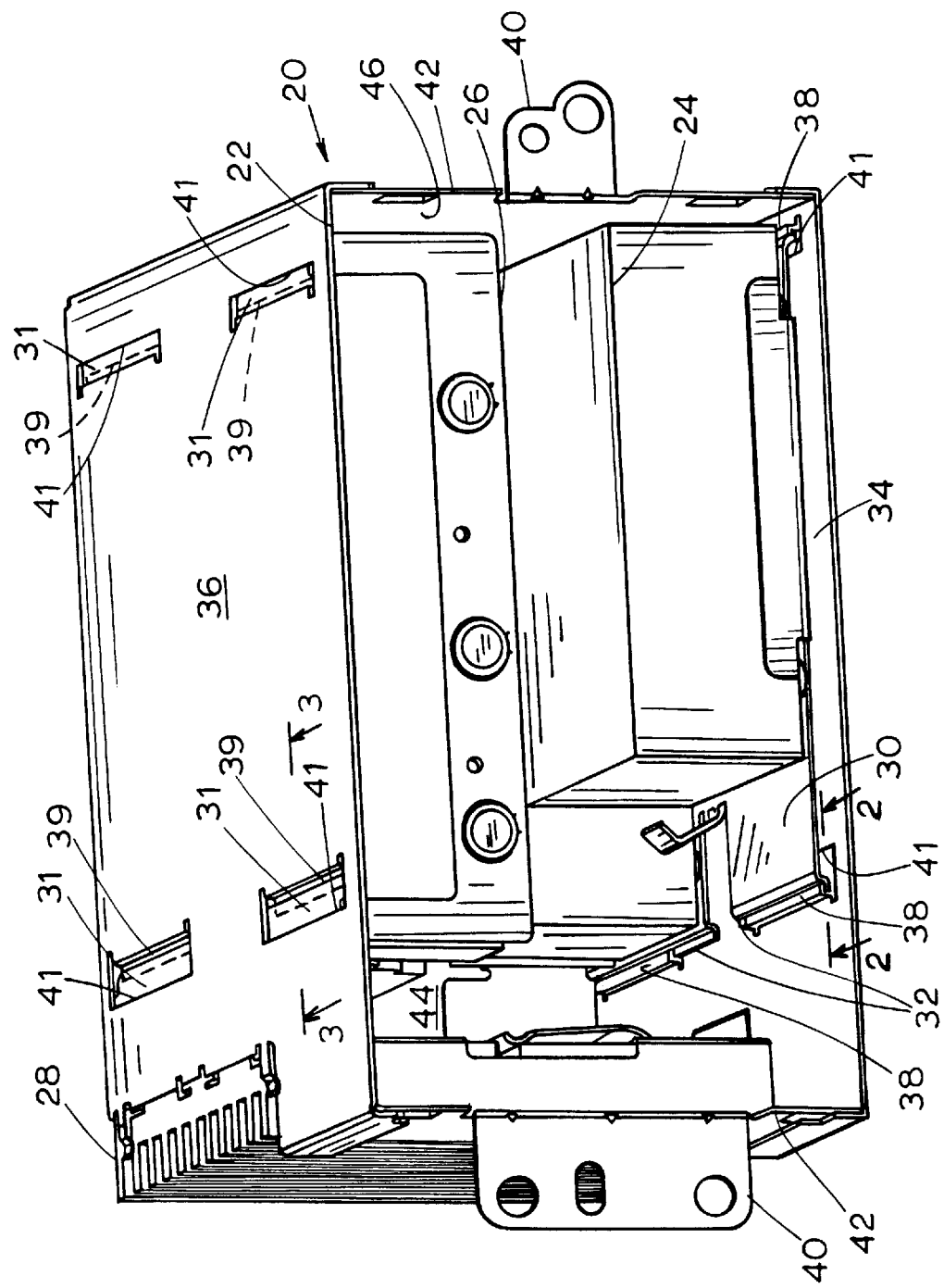
FIG. 1 is a perspective view of an electrical assembly in accordance with the present invention.

The invention provides an improved method and apparatus for constructing an electrical assembly. Now referring to FIG. 1, the invention will now be described in the context of an exemplary electrical package: an automobile receiver/tape player assembly, generally indicated at 20. The receiver/tape player assembly 20 includes a chassis 22, constructed of sheet metal, that supports and surrounds a first subassembly 24 and a second subassembly 26. Each subassembly 24, 26 can be any one of a variety of devices such as a tape playing mechanism, a CD playing mechanism or a radio receiver device. A convector 28 is attached to the chassis 22 in order to dissipate heat created by various electrical devices contained within the chassis 22. The first subassembly 24 includes a sheet metal support plate 30 having edges 32. The second subassembly 26 includes sheet metal support members 31 each having edges 33. The chassis 22 includes a first planar surface 34 and a second planar surface 36.

Figure 2:
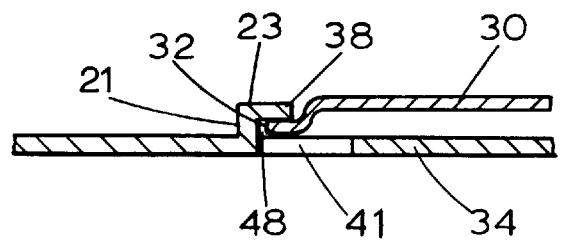
FIG. 2 is a partial, enlarged cross-sectional view taken along line 2—2 of FIG. 1.

The first planar surface 34 includes flanges 38 that are formed during a stamping process used to form the first planar surface 34. As seen in FIG. 2, each flange 38 includes a first portion 21 that is substantially perpendicular to the first planar surface 34 and a second portion 23 that is substantially parallel to the first planar surface 34.

Figure 3:
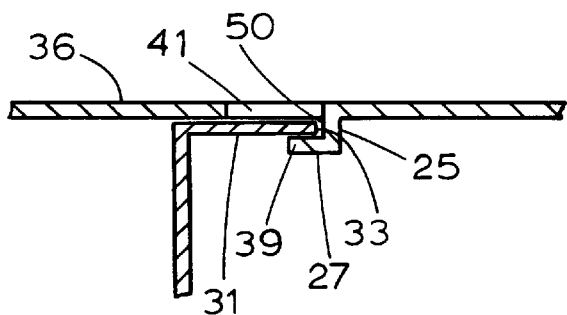
FIG. 3 is a partial, enlarged cross-sectional view taken along line 3—3 of FIG. 1.

Similarly, the second planar surface 36 includes flanges 39 that are formed during a stamping process used to form the second planar surface 36. As seen in FIG. 3, each flange 39 includes a first portion 25 that is substantially perpendicular to the second planar surface 36 and a second portion 27 that is substantially parallel to the second planar surface 36. As each of the flanges 38, 39 is preferably formed during a stamping operation, openings 41 corresponding to each of the flanges 38, 39 are also formed in the chassis 22 during the stamping operation.

The chassis 22 includes mounting plates 40 extending from sides 42 of the chassis 22. The chassis 22 also includes a rear planar surface 44. The first planar surface 34, second planar surface 36, sides 42 and rear planar surface 44 of the chassis 22 together define a rectangularly box-shaped enclosure that is covered by a face plate (not shown) when the receiver/tape player assembly is installed in an automobile (not shown). The mounting plates 40 are adapted to be rigidly attached to suitable structure of the automobile, such as a console (not shown).

As seen in FIG. 1 and FIG. 2, each edge 32 of the support plate 30 is adapted to slide into an inwardly-facing channel-shaped passage 48 defined by a corresponding one of the flanges 38 and the first planar surface 34. Similarly, as seen FIG. 1 and FIG. 3, each edge 33 of each support member 31 is adapted to slide into an outwardly-facing channel-shaped passage 50 defined by a corresponding one of the flanges 39 and the second planar surface 36. Thus, to assemble the receiver/tape player assembly 20, the corresponding edge 32 or 33 is inserted into the channel-shaped passage 48 or 50.

Each opening 41 is adapted to be covered by the corresponding edge 32 or 33 when the receiver/tape player assembly 20 is assembled, thereby effectively preventing EMI emissions and/or susceptibility problems that could result if the openings 41 were not covered.

Figure 4:
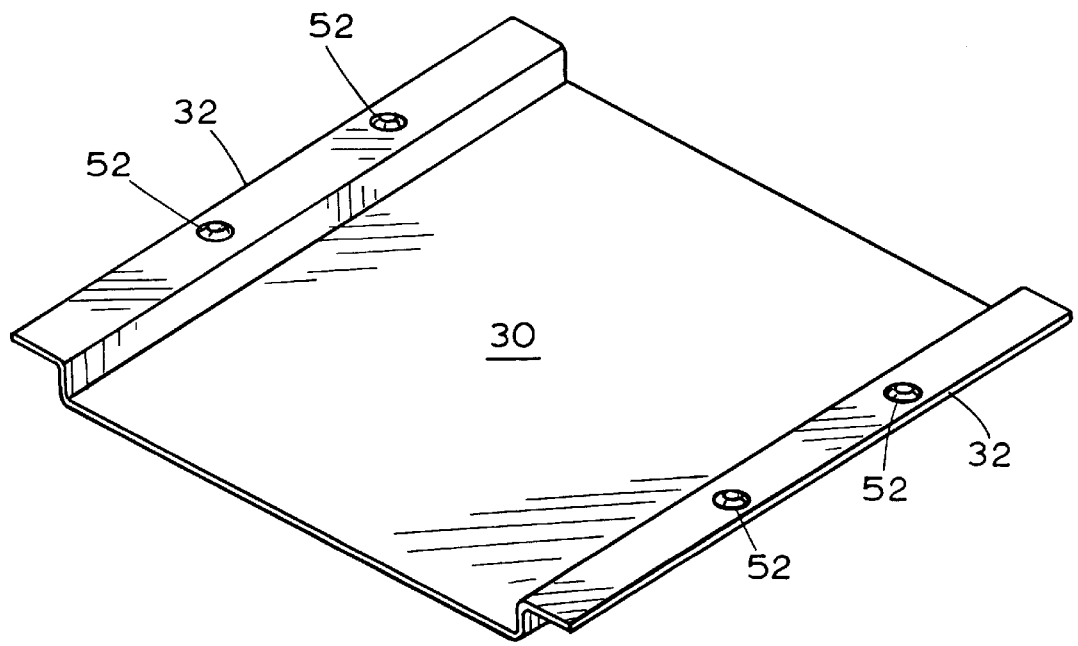
FIG. 4 is a perspective view of a mounting plate including vertical retaining features in accordance with the present invention.
Figure 5:
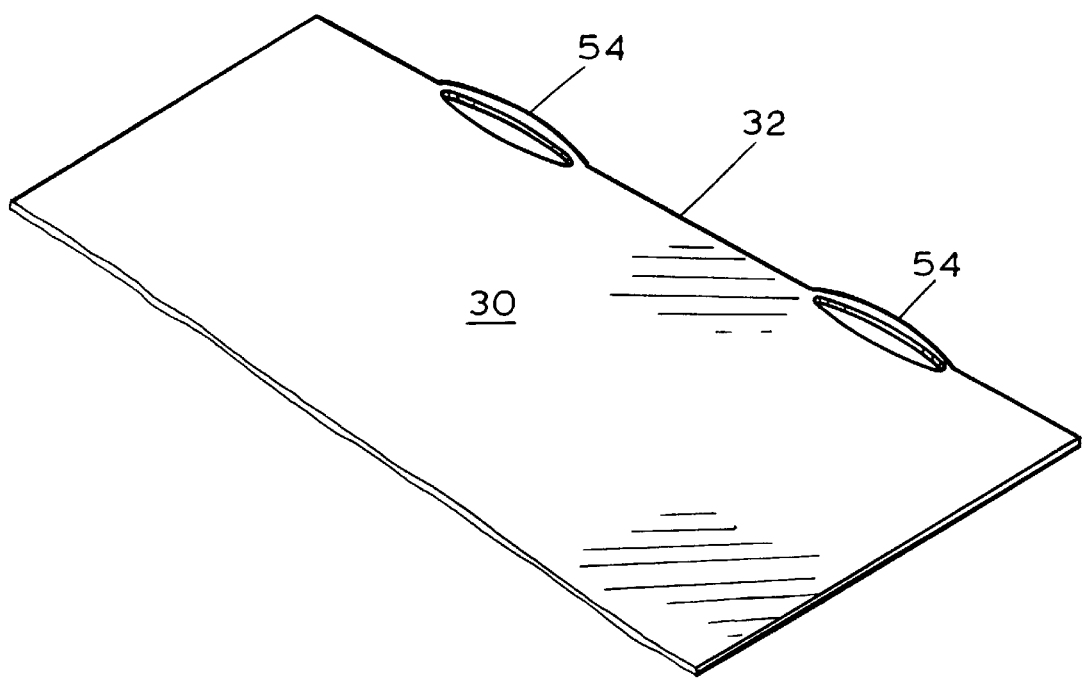
FIG 5. is a fragmentary perspective view of a mounting plate including lateral retaining features in accordance with the present invention.

Dimensional tolerancing of the flanges 38, 39 and the edges 32, 33 may be used to ensure that a sufficient frictional fit is achieved therebetween. However, to ensure a secure, rattle-free fit even in the absence of tight tolerancing, one or more vertical (i.e. extending in a direction orthogonal to the plane of the sheet metal) and/or lateral (i.e. extending in a direction coplanar to the plane of the sheet metal) retaining features such as raised portions 52 (FIG. 4) and/or edge extensions 54 (FIG. 5), respectively, may be included on the support plate 30 and support member 31, and/or on the flanges 38, 39. These retaining features may be incorporated during a single stamping operation used to form the support plate 30, support member 31, first planar surface 34 or second planar surface 36.

Figure 7:
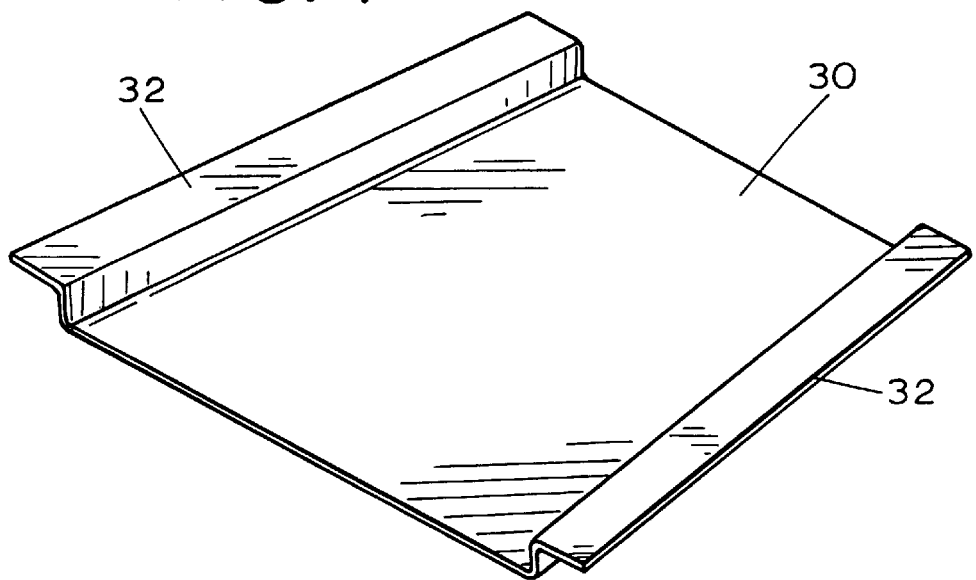
FIG 7. is a fragmentary perspective view of a support plate having tapered edges in accordance with the present invention.

In order to ensure that a subassembly such as the first subassembly 24 is oriented correctly within the chassis 22, the edges 32 and flanges 38 can be offset as seen in FIG. 6. Alternatively, the edges 32 may be tapered at an angle as shown in FIG. 7 to fit into a pair of flanges (not shown) having a corresponding taper angle.

Of course, it should be understood that a range of changes and modifications can be made to the preferred embodiment described above. It is therefore intended that the foregoing detailed description be regarded as illustrative rather than limiting and that it be understood that it is the following claims, including all equivalents, which are intended to define the scope of this invention.

The embodiments of the invention in which an exclusive property or privilege is claimed are defined as follows:

1. An electrical package comprising:

a chassis including at least one flange extending therefrom;

a subassembly including a mounting plate having at least one edge portion received in said at least one flange so as to slidably retain said subassembly with respect to said chassis; and a retaining feature formed on said edge portion of said mounting plate, said retaining feature protruding from said edge portion and engaging said at least one flange so as to help retain said mounting plate with respect to said chassis.

2. The electrical package of claim 1, wherein said at least one edge portion is planar, and said retaining feature comprises an extension of said at least one edge portion that is coplanar with said edge portion.

3. The electrical package of claim 2, wherein the extension of said at least one edge portion comprises a portion of material extending laterally beyond said at least one edge portion.

4. An electrical package comprising a chassis, a subassembly including a mounting plate having first and second opposing edges, and first and second laterally opposed flange means extending from said chassis so as to receive said first and second opposing edges of said mounting plate, respectively, and slidably retain said subassembly with respect to said chassis, the improvement wherein:

the first flange means comprises first and second flange portions, the second flange portion being laterally offset with respect to the first flange portion; and the first edge of said mounting plate comprises first and second edge portions, the first edge portion being received within said first flange portion, and the second edge portion being laterally offset with respect to the first edge portion and received within said second flange portion, thereby to ensure a correct orientation of said subassembly with respect to said chassis.

* * * * *